US012600104B2

(12) United States Patent
Kaouk et al.

(10) Patent No.: US 12,600,104 B2
(45) Date of Patent: Apr. 14, 2026

(54) PRESSING TOOL AND METHOD FOR PRODUCING A PRESS PLATE

(71) Applicant: HUECK Rheinische GmbH, Viersen (DE)

(72) Inventors: Ali Kaouk, Viersen (DE); Thorsten Hagedorn, Krefeld (DE); Berthold Thölen, Viersen (DE)

(73) Assignee: HUECK Rheinische GmbH, Viersen (DE)

( * ) Notice: Subject to any disclaimer, the term of this patent is extended or adjusted under 35 U.S.C. 154(b) by 301 days.

(21) Appl. No.: 18/571,928

(22) PCT Filed: Oct. 25, 2022

(86) PCT No.: PCT/EP2022/079756
§ 371 (c)(1),
(2) Date: Dec. 19, 2023

(87) PCT Pub. No.: WO2023/078730
PCT Pub. Date: May 11, 2023

(65) Prior Publication Data
US 2024/0278522 A1 Aug. 22, 2024

(30) Foreign Application Priority Data
Nov. 4, 2021 (DE) .......................... 102021128738.3

(51) Int. Cl.
B30B 15/06 (2006.01)
B44B 5/00 (2006.01)
(Continued)

(52) U.S. Cl.
CPC .......... B30B 15/062 (2013.01); B44B 5/0052 (2013.01); C23C 14/042 (2013.01); C23C 14/067 (2013.01); C23C 14/35 (2013.01)

(58) Field of Classification Search
CPC ......... B30B 15/062; B30B 15/06; B30B 5/04; B30B 3/005; B44B 5/0052; B44B 5/02;
(Continued)

(56) References Cited

U.S. PATENT DOCUMENTS 6,190,514 B1 2/2001 Ma et al.
2013/0299454 A1 11/2013 Marxen et al.
(Continued)

FOREIGN PATENT DOCUMENTS

AT 407534 B 4/2001
AU 1549199 A 9/1999
(Continued)

OTHER PUBLICATIONS

Translation of WO-03016034.*
(Continued)

*Primary Examiner* — Bobby Yeonjin Kim
(74) *Attorney, Agent, or Firm* — Miller Nash LLP

(57) ABSTRACT

A pressing tool for producing a workpiece having a pressing surface comprises a base structure and at least two ceramic layers which are arranged on top of one another on the surface and form the pressing surface, of which one of the ceramic layers is a full-surface ceramic layer with one degree of gloss and the other is a partial ceramic layer with a further degree of gloss which differs from the degree of gloss of the full-surface ceramic layer.

16 Claims, 3 Drawing Sheets

(51) Int. Cl.
  *C23C 14/04*        (2006.01)
  *C23C 14/06*        (2006.01)
  *C23C 14/35*        (2006.01)

(58) Field of Classification Search
  CPC ..... B44B 5/026; C23C 14/042; C23C 14/067;
                                                      C23C 14/35
  See application file for complete search history.

(56)                  References Cited

U.S. PATENT DOCUMENTS

2016/0193866 A1    7/2016  Stoffel et al.
2017/0226630 A1    8/2017  Ma

FOREIGN PATENT DOCUMENTS

| CH | 681083 | A5 | 1/1993 |
| CN | 1230604 | A | 10/1999 |
| CN | 103659954 | A | 3/2014 |
| CN | 110344093 | A | 10/2019 |
| DE | 102019127659 | A1 | 4/2021 |
| EP | 0470359 | A2 | 2/1992 |
| EP | 1063085 | A1 | 12/2000 |
| EP | 1184480 | A2 | 3/2002 |
| EP | 2497650 | A1 | 9/2012 |
| JP | S63203222 | A | 8/1988 |
| JP | H11314237 | A | 11/1999 |
| JP | 2000192635 | A | 7/2000 |

| JP | 2006116607 | A | 5/2006 | | |
| JP | 2008189956 | A | 8/2008 | | |
| JP | 2011503357 | A | 1/2011 | | |
| JP | 2014012615 | A | 1/2014 | | |
| JP | 2014504965 | A | 2/2014 | | |
| JP | 2015519217 | A | 7/2015 | | |
| JP | 2016530397 | A | 9/2016 | | |
| JP | 2016538162 | A | 12/2016 | | |
| JP | 2017104901 | A | 6/2017 | | |
| RU | 2133199 | C1 | 7/1999 | | |
| RU | 2726133 | C2 | 7/2020 | | |
| WO | WO-03016034 | A1 * | 2/2003 | ........... | B30B 15/062 |
| WO | WO-2009062488 | A2 * | 5/2009 | ........ | C23C 18/1605 |
| WO | WO-2012119586 | A1 * | 9/2012 | ............... | C25F 3/16 |
| WO | 2021074064 | A1 | 4/2021 | | |

OTHER PUBLICATIONS

Translation of WO-2009062488.*
Translation of WO-2012119586.*
European Patent Office. International Search Report and Written
Opinion of the International Searching Authority in Application No.
PCT/EP2022/079756, mailed Feb. 23, 2023, 15 pages.
European Patent Office. International Search Report and Written
Opinion of the International Searching Authority in Application No.
PCT/EP2022/079757, mailed Feb. 22, 2023, 18 pages.
Kaouk. U.S. Appl. No. 18/571,933, the U.S. National Phase of
International Patent Application No. PCT/EP2022/079757, filed
Oct. 25, 2022, 76 pages.

* cited by examiner

PRESSING TOOL AND METHOD FOR PRODUCING A PRESS PLATE

RELATED APPLICATIONS

This application is a national stage under 35 U.S.C. § 371 of International Application No. PCT/EP2022/079756, filed Oct. 25, 2022, which claims priority of German Patent Application No. 10 2021 128 738.3, filed Nov. 4, 2021.

TECHNICAL FIELD

The field of the disclosure relates to a pressing tool with a pressing surface and a method for producing a pressing tool.

BACKGROUND

Pressing tools, for example in the form of press plates, endless belts or embossing rollers are, in particular, used in the woodworking industry, for example to produce furniture, laminates or panels, i.e., generally workpieces. The workpieces are pressed with the pressing surface of the pressing tool, such that the workpieces obtain surfaces corresponding to the pressing surface.

WO 2009/062488 A2 discloses a method for processing a structured pressing surface of an embossing tool. The surface is provided with a first chromium layer over the entire surface, on which at least one further chromium layer is arranged in predetermined areas. The degrees of gloss of the two chromium layers differ. By use of the pressing surface, a workpiece formed as a material board with a structured surface, which has different degrees of gloss, may be produced. Due to the use of the chromium layers, the production of this pressing tool is relatively environmentally harmful.

U.S. Pat. No. 6,190,514 B1 discloses a method for producing a flat pressing surface to make a decorative laminate from resin-impregnated paper. This is accomplished by creating a desired finish on a planar pressing surface, removing impurities from the planar surface, and coating the planar surface with hafnium diboride, molybdenum diboride, tantalum diboride, titanium diboride, tungsten diboride, vanadium diboride, zirconium diboride, or mixtures of these substances in a surface magnetron sputter coating system to a Vickers hardness of at least 2000 HV, by moving the planar surface and a sputter head of the surface magnetron sputter coating system relative to each other at a scan speed sufficient to produce a thermal gradient of 27.78° C. or less in the planar pressing surface.

A need remains for a pressing tool with a pressing surface having different degrees of gloss in certain areas, the manufacture of which is relatively environmentally friendly.

SUMMARY

A pressing tool for producing a workpiece comprises a pressing surface, a base structure, and at least two ceramic layers which are arranged on top of one another on the surface and form the pressing surface, of which one of the ceramic layers is a full-surface ceramic layer with one degree of gloss and the other is a partial ceramic layer with a further degree of gloss which differs from the degree of gloss of the full-surface ceramic layer.

The pressing tool according to the present disclosure is, for example, an endless belt or an embossing roller. Preferably, the pressing tool according to the present disclosure is a press plate.

The pressing surface is, for example, smooth, but can also be configured as a structured pressing surface. In particular, the pressing surface may thus have a structure of protrusions and recesses, and the base structure may have a structured surface corresponding to the structure of the pressing surface.

Also disclosed is a method for producing the pressing tool according to the present disclosure, comprising the following method steps:
- providing the base structure,
- applying one of the ceramic layers onto the surface of the base structure, and
- applying a further one of the ceramic layers onto the ceramic layer applied onto the structured surface, wherein the degrees of gloss of the two ceramic layers differ.

The pressing tool according to the present disclosure accordingly comprises the base structure, which, according to a variant, has a structured surface corresponding to the pressing surface optionally formed as a structured pressing surface. The base structure comprises, for example, multiple partial metal layers arranged one above the other, which form the surface of the base structure, as is known, for example, from WO 2009/062488 A2 mentioned in the introduction.

However, in order to obtain a relatively hard pressing surface, the surface of the base structure is not provided with a chromium layer, but with the ceramic layers. Ceramics can also be configured to be relatively hard and can have, for example, a Vickers hardness of at least 2000 H V. Suitable ceramic materials of the ceramic layers are, for example, hafnium diboride, molybdenum diboride, tantalum diboride, titanium diboride, tungsten diboride, vanadium diboride, zirconium diboride or mixtures of these ceramic materials. The application and/or coating of the ceramic layers is significantly more environmentally friendly compared to the application and/or coating with the chromium layer.

Furthermore, the pressing tool according to the present disclosure comprises at least two ceramic layers arranged one above the other, preferably exactly two ceramic layers arranged one above the other. One of the ceramic layers is a partial ceramic layer and the other is a full-surface ceramic layer. Since, according to the present disclosure, the degrees of gloss of the full-surface ceramic layer differ from those of the partial ceramic layer, the pressing surface has different degrees of gloss in different areas, as a result of which the surface of the workpiece produced with the press plate also has correspondingly different degrees of gloss in certain areas. This can improve the quality of the workpieces produced by pressing with the pressing surface. Workpieces are, for example, material boards, in particular laminates or panels.

In particular, it is also possible to remove a worn or damaged ceramic layer from the base structure relatively easily in order to provide the base structure with new ceramic layers. This results in a relatively inexpensive repair of a worn or damaged pressing tool.

The ceramic layers can be applied, for example, using a surface magnetron sputter coating system.

The thicknesses of the two ceramic layers are preferably in the range between 1 μm and 2 μm.

In order to obtain the different degrees of gloss of the full-surface ceramic layer and the partial ceramic layer, the thickness of the full-surface ceramic layer is preferably different from the thickness of the partial ceramic layer. This is due to the fact that it is possible to adjust the degree of gloss of the corresponding ceramic layer by its thickness. In this case, the two ceramic layers preferably consist of the same ceramic material, which can have a positive effect on the manufacturing costs of the pressing tool according to the present disclosure. The required thickness of the ceramic layers can be achieved during the manufacture of the press plate, for example, by suitably controlling the surface magnetron sputter coating system.

The degree of gloss of the two ceramic layers can also be adjusted by using different ceramic materials for the partial and full-surface ceramic layers. According to a variant of the press plate according to the present disclosure, the ceramic materials of the two ceramic layers can therefore differ in order to obtain the different degrees of gloss of the full-surface ceramic layer and the partial ceramic layer. In this case, in particular, the thickness of the full-surface ceramic layer is equal to the thickness of the partial ceramic layer.

Preferably, the partial ceramic layer is arranged between the full-surface ceramic layer and the surface of the base structure. This embodiment of the press plate according to the present disclosure can be produced, for example, by
- applying a partial mask onto the surface of the base structure,
- applying a ceramic layer onto the surface provided with the mask in areas not covered by the mask,
- removing the mask so that the partial ceramic layer is arranged on the structured surface, and
- applying the full-surface ceramic layer onto the partial ceramic layer.

However, the partial ceramic layer can also be produced, for example, by suitably controlling the surface magnetron sputter coating system.

Since, according to this variant of the pressing tool, the full-surface ceramic layer is applied onto the partial ceramic layer, a relatively smooth pressing surface can be produced in a relatively simple manner. In this case, however, the full-surface ceramic layer must be configured such that it does not completely cover the degree of gloss of the underlying partial ceramic layer. In particular, in this case, the full-surface ceramic layer is thinner than the partial ceramic layer, i.e., the thickness of the full-surface ceramic layer is smaller than the thickness of the partial ceramic layer.

However, the pressing tool according to the present disclosure can also be configured such that the full-surface ceramic layer is arranged between the partial ceramic layer and the structured surface of the base structure, i.e., that the partial ceramic layer is applied onto the full-surface ceramic layer. This embodiment of the pressing tool according to the present disclosure can be produced, for example, by
- applying the full-surface ceramic layer onto the surface of the base structure,
- applying a partial mask onto the full-surface ceramic layer,
- applying a ceramic layer onto the full-surface ceramic layer provided with the mask in areas not covered by the mask,
- removing the mask so that the partial ceramic layer is arranged on the full-surface ceramic layer.

However, the partial ceramic layer can also be produced, for example, by suitably controlling the surface magnetron sputter coating system.

The degrees of gloss of the partial and the full-surface ceramic layers can be achieved by a post-treatment of the corresponding applied ceramic layer to obtain a predetermined degree of gloss of the corresponding ceramic layer. A post-treatment may comprise, for example, a polishing or a laser treatment of the corresponding ceramic layer.

According to an embodiment of the pressing tool according to the present disclosure, the surface of the base structure may have different degrees of gloss in different areas, which differ in particular from the degrees of gloss of the full-surface ceramic layer and the partial ceramic layer. The adjustment of the different degrees of gloss of the surface of the base structure can be carried out, for example, by means of a laser or, in case of the base structure of multiple layers arranged one above the other, is known from WO 2009/062488 A2.

BRIEF DESCRIPTION OF THE DRAWINGS

Exemplary embodiments are shown in the enclosed schematic figures by way of example. These show.

DETAILED DESCRIPTION

Figure 1:
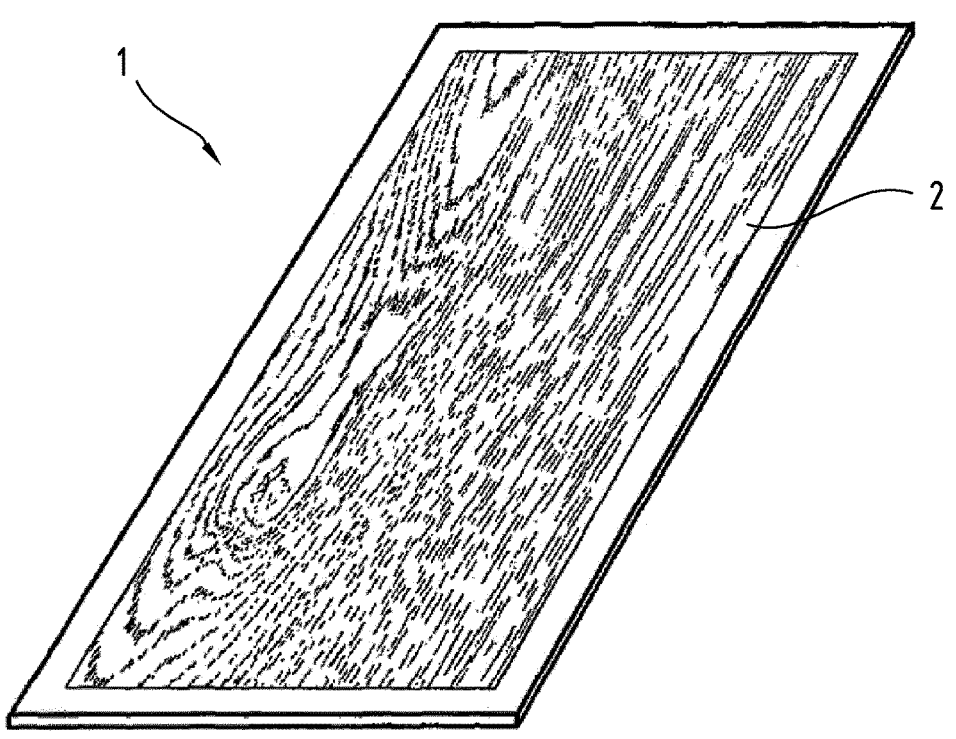
FIG. 1 a press plate with a pressing surface in a perspective representation.
Figure 2:
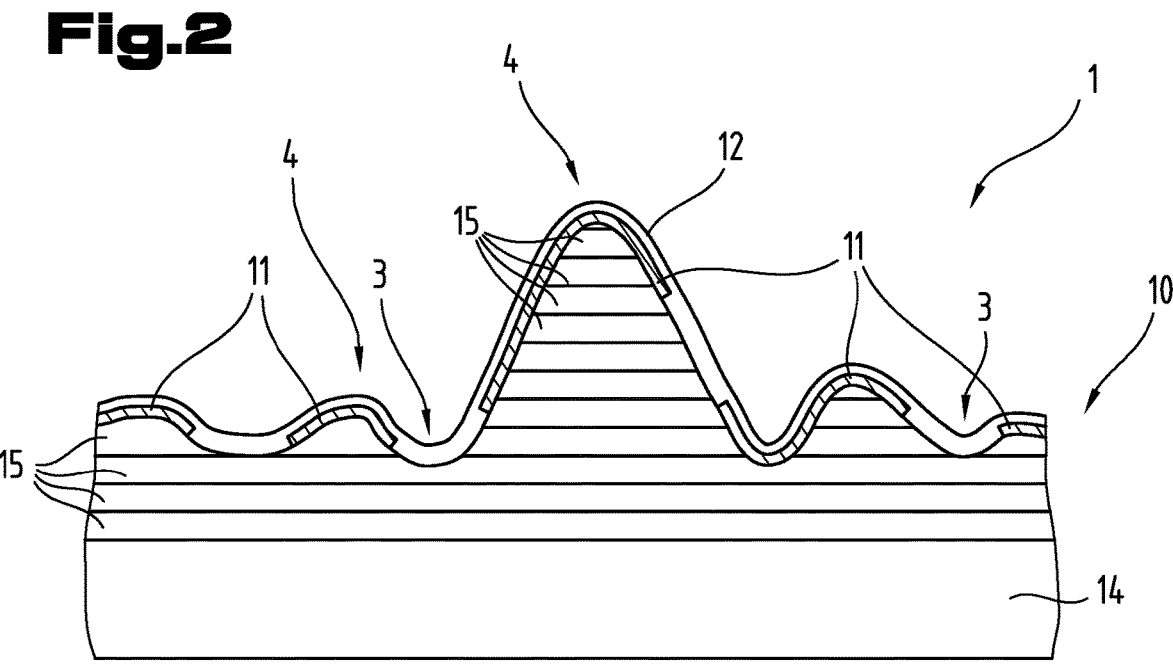
FIG. 2 a cutout from a lateral view of the press plate in a sectional representation, FIGS. 3A, 3B and 3C intermediate states of the press plate during its production.

FIG. 1 shows a perspective view of a pressing tool which is configured as a press plate 1 in the case of the present exemplary embodiment. The press plate comprises a pressing surface 2. FIG. 2 shows a cutout from a lateral view of the press plate 1 in a sectional view.

The pressing surface 2 may be configured to be smooth, but in the case of the present embodiment, it comprises a structure of the protrusions 4 and recesses 3.

The structure of the pressing surface 2 is, in particular, assigned to a natural material that is wood in the case of the present exemplary embodiment.

By the press plate 1, a workpiece, e.g. a press plate, for example a laminate, can be produced by pressing. After pressing, the workpiece has a structured surface corresponding to the structure of the pressing surface 2.

Figure 3A:
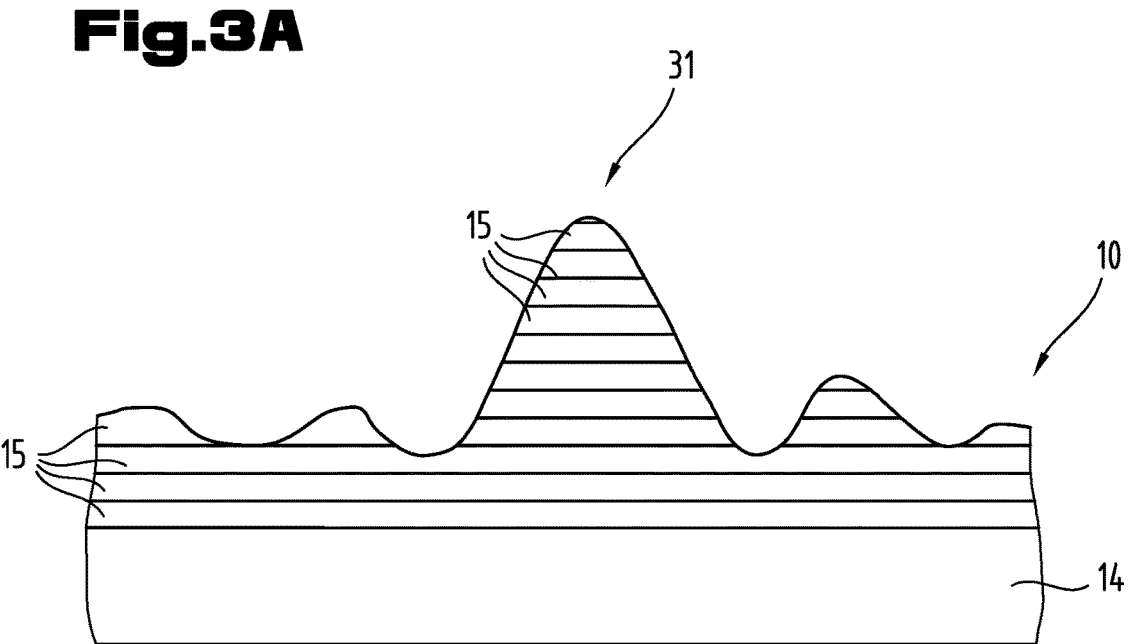

In the case of the present exemplary embodiment, the press plate 1 comprises a base structure 10, shown in FIG. 3A, with a structured surface 31 assigned to the structure of the pressing surface 2.

In the case of the present exemplary embodiment, the press plate 1 comprises a partial ceramic layer 11 arranged on the structured surface 31 of the base structure 10 and a full-surface ceramic layer 12 arranged on the partial ceramic layer 11 to form the pressing surface 2.

In the case of the present exemplary embodiment, the base structure 10 is made of metal.

In the case of the present exemplary embodiment, the pressing plate 1 comprises a base carrier, in particular a base carrier plate 14, for example of metal, on which the base structure 10 is arranged.

In the case of the present exemplary embodiment, the base structure 10 comprises multiple base metal layers 15 located on top of one another. The base metal layers 15 are preferably made of nickel and are at least partially configured to be partial.

The base structure 10 may be produced, for example by applying a mask not shown in more detail at least once to a base metal layer 15 dependent on image data assigned to the structure of the structured pressing surface 2, in order to cover areas, and subsequently applying a further base metal layer 15 onto the areas not covered by said mask. This is repeated until the base structure 10 has been formed. The base structure 10 is produced particularly dependent on image data assigned to the structure of the pressing surface 2, i.e. dependent on the protrusions 4 and recesses 5, by applying the masks and the base metal layers 15, dependent on this image data, subsequently for example by means of a galvanic or chemical method.

Figure 3B:
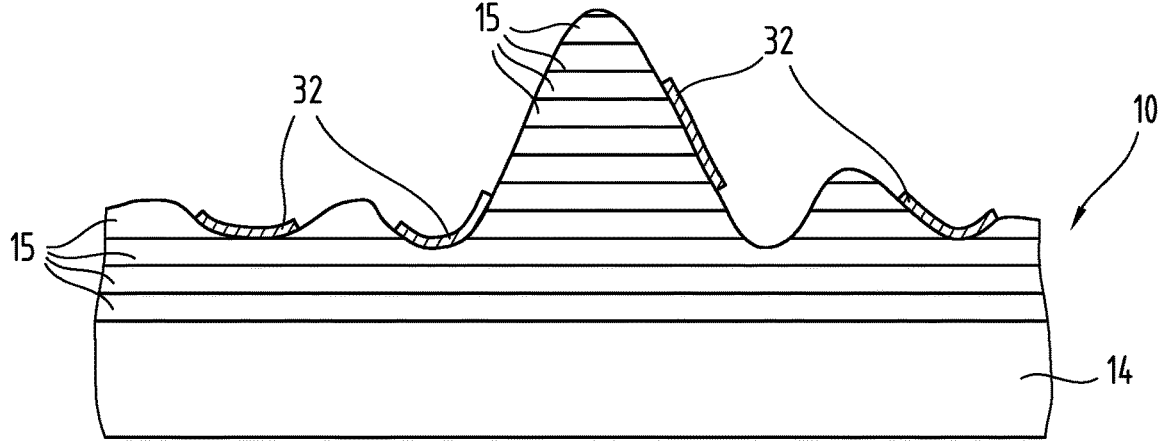

Subsequently, in the case of the present exemplary embodiment, a mask 32 shown in FIG. 3B is applied to the structured surface 31 of the base structure 10 to partially cover the structured surface 31 of the base structure 10.

Figure 3C:
Figure 3C:
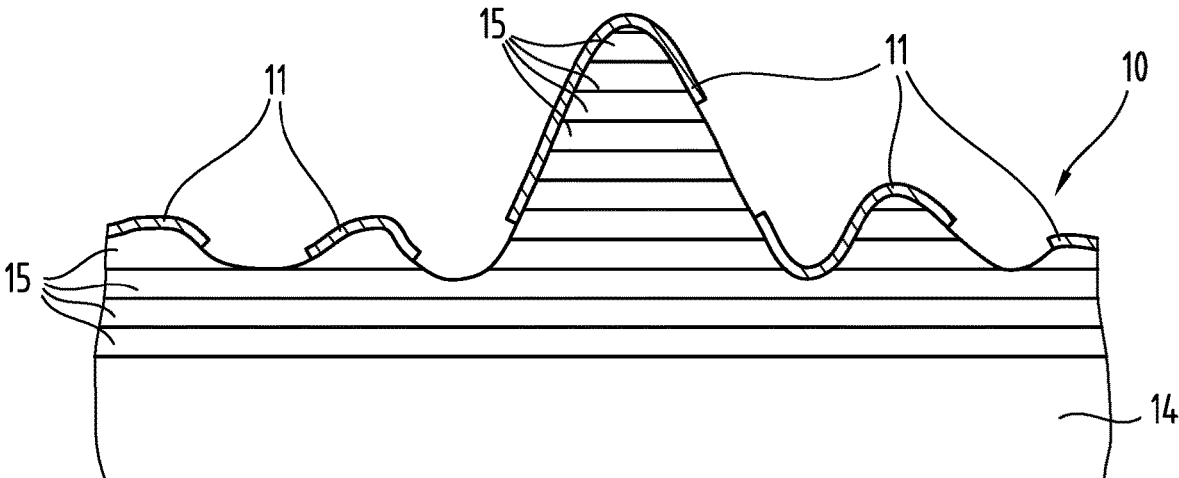

Subsequently, in the case of the present embodiment, a ceramic layer is applied to the areas of the structured surface 31 of the base structure 10 not covered by the mask 32 by means of a surface magnetron sputter coating system 33. Subsequently, the mask 32 is removed so that only the areas of the structured surface 31 of the base structure 10 not covered by the mask 32 are covered with the ceramic layer, whereby the partial ceramic layer 11 is created, see FIG. 3c. By suitably controlling the surface magnetron sputter coating system 33, the partial ceramic layer 11 is provided with a predetermined thickness, whereby it obtains a predetermined degree of gloss.

Subsequently, in the case of the present exemplary embodiment, the full-surface ceramic layer 12 is applied to the partial ceramic layer 11 by means of the surface magnetron sputter coating system 33. In order to adjust the degree of gloss of the full-surface ceramic layer 12, it is provided with a predetermined thickness controlled by the surface magnetron sputter coating system 33.

In the case of the present exemplary embodiment, the two ceramic layers 11, 12 are made of the same ceramic material, for example, hafnium diboride, molybdenum diboride, tantalum diboride, titanium diboride, tungsten diboride, vanadium diboride, zirconium diboride or mixtures of these ceramic materials.

In order for the ceramic layers 11, 12 to have different degrees of gloss, the thicknesses of the two ceramic layers differ in the case of the present exemplary embodiment. In particular, the full-surface ceramic layer 12 is thinner than the partial ceramic layer 11. In particular, the two ceramic layers 11, 12 consist of the same ceramic material.

The thicknesses of the two ceramic layers 11, 12 are preferably in the range between 1 μm and 2 μm.

The ceramic layers preferably have a Vickers hardness of at least 2000 HV.

To set different degrees of gloss of the ceramic layers 11, 12, these may also have different ceramic materials.

To allow for the degrees of gloss of the ceramic layers 11, 12 to be set, these can also be subjected to a subsequent treatment, for example polishing or a laser treatment.

It is also possible to first provide the structured surface 31 of the base structure 10 with the full-surface ceramic layer 12 and to apply the partial ceramic layer 11 onto the latter.

It is also possible to produce the partial ceramic layer 11 by suitably controlling the surface magnetron sputter coating system 33.

The invention claimed is:

1. A pressing tool for producing a workpiece, comprising:
a pressing surface,
a base structure, which comprises a surface, and
at least two ceramic layers which are arranged on top of one another on the surface and form the pressing surface, of which one of the ceramic layers is a full-surface ceramic layer with one degree of gloss and the other is a partial ceramic layer with a further degree of gloss which differs from the degree of gloss of the full-surface ceramic layer.

2. The pressing tool according to claim 1, wherein the pressing surface has a structure of protrusions and recesses, and the base structure comprises a structured surface corresponding to the structure of the pressing surface, and wherein the base structure comprises multiple partial metal layers arranged one above the other, which form the structured surface of the base structure.

3. The pressing tool according to claim 1, wherein the thickness of the full-surface ceramic layer differs from the thickness of the partial ceramic layer in order to obtain the different degrees of gloss of the full-surface and the partial ceramic layers.

4. The pressing tool according to claim 1, wherein the ceramic material of the two ceramic layers differs in order to obtain the different degrees of gloss of the full-surface and the partial ceramic layers.

5. The pressing tool according to claim 1, wherein the partial ceramic layer is arranged between the full-surface ceramic layer and the structured surface of the base structure.

6. The pressing tool according to claim 1, wherein the thicknesses of the ceramic layers are in the range between 1 μm and 2 μm.

7. The pressing tool according to claim 1, wherein the surface of the base structure has different degrees of gloss in different areas, which differ from the degrees of gloss of the full-surface and the partial ceramic layers.

8. A method for producing a pressing tool, comprising the following method steps:
providing a base structure, having a surface,
applying a first ceramic layer onto the surface of the base structure, and
applying a second ceramic layer onto the first ceramic layer, wherein one of the first and second ceramic layers is a full-surface ceramic layer and the other of the first and second ceramic layers is a partial ceramic layer, and wherein the degrees of gloss of the first and second ceramic layers differ.

9. The method according to claim 8, comprising:
applying a partial mask onto the surface of the base structure,
applying the first ceramic layer onto the surface in areas not covered by the partial mask,
removing the partial mask so that the first ceramic layer forms the partial ceramic layer on the surface, and
wherein applying the second ceramic layer includes applying the full-surface ceramic layer onto the partial ceramic layer.

10. The method according to claim 8, further comprising:
applying the full-surface ceramic layer onto the surface of the base structure,
applying a partial mask onto the full-surface ceramic layer,
applying the partial ceramic layer onto the full-surface ceramic layer in areas not covered by the mask,
removing the mask so that the partial ceramic layer is arranged on the full-surface ceramic layer.

11. The method according to claim 8, further comprising treatment of the first and/or second ceramic layers after their application, in order to obtain a predetermined degree of gloss of the corresponding ceramic layer.

12. The method according to claim 8, wherein the first and/or second ceramic layers are applied by magnetron sputtering.

13. The pressing tool according to claim 3, wherein the first and second ceramic layers consist of the same type of ceramic material.

14. The pressing tool according to claim 4, wherein the thickness of the full-surface ceramic layer is equal to the thickness of the partial ceramic layer.

15. The pressing tool according to claim 1, wherein the partial ceramic layer is arranged above the full-surface ceramic layer.

16. The pressing tool according to claim 1, wherein the ceramic material of the ceramic layers is selected from the group consisting of hafnium diboride, molybdenum diboride, tantalum diboride, titanium diboride, tungsten diboride, vanadium diboride, zirconium diboride and mixtures thereof.

\* \* \* \* \*